United States Patent [19]

Bacher

[11] Patent Number: 5,506,513

[45] Date of Patent: Apr. 9, 1996

[54] MICROWAVE CIRCUIT TEST FIXTURE

[76] Inventor: Helmut Bacher, P.O. Box 6326, Brookings, Oreg. 97415

[21] Appl. No.: 372,293

[22] Filed: Jan. 13, 1995

[51] Int. Cl.[6] .............................. H01P 1/04; G01R 31/02
[52] U.S. Cl. ............................ 324/755; 333/33; 333/246; 333/260; 439/581; 439/63
[58] Field of Search ............................. 324/755; 333/33, 333/246, 260; 439/581, 63

[56] References Cited

U.S. PATENT DOCUMENTS

| | | | |
|---|---|---|---|
| 4,365,195 | 12/1982 | Stegens | 324/755 |
| 4,535,307 | 8/1985 | Tsukii | 333/35 |
| 4,538,124 | 8/1985 | Morrison | 333/246 |
| 4,724,409 | 2/1988 | Lehman | 333/260 |
| 5,402,088 | 3/1995 | Pierro et al. | 333/33 |

Primary Examiner—Kenneth A. Wieder
Assistant Examiner—Barry C. Bowser
Attorney, Agent, or Firm—Michael J. Hughes; Bradley T. Sako

[57] ABSTRACT

A microwave test fixture (10) for testing a two port microwave integrated circuit (MIC) (11) including a first signal block (12) and an opposing second signal block (14). Each signal block (12 and 14) includes an inside face (20 and 36) with an overhang portion (30 and 46), a vertical channel (52 and 62) and a connector aperture (70 and 72). The connector apertures (70 and 72) each receive a connector assembly (78 and 80) that includes a coaxial connector (82 and 108), a conductive sleeve (84 and 110) and an insulative bead (112 and 86). A signal contact (88 and 114) extends from an inner conductor 90 of each coaxial connector (82 and 108), through the insulative bead (112 and 86) and vertical channel (52 and 62) and out from the inside face (20 and 36) below the overhang portion (30 and 46). Each signal contact (88 and 114) includes a contact spring section (100). A circuit bed (16) is disposed between the signal blocks (12 and 14) and includes a ground leaf spring (146) with a first ground end (148) and a second ground end (150). The circuit bed (16) moves vertically between a test position and a load position. In the load position the circuit bed (16) is lowered to receive the MIC (11). In the test position the circuit bed (16) contains the MIC (11) and is raised so that a top of the MIC (138) contacts the overhang portions (30 and 46), the signal contacts (88 and 114) contact the MIC pads (176 and 178), and the ground ends (148 and 150) make simultaneous contact with an MIC ground plate (172) and the inside faces (20 and 36) of the signal blocks (12 and 14), providing a short current ground path between the MIC (11) and the signal blocks (12 and 14).

20 Claims, 9 Drawing Sheets

5,506,513

MICROWAVE CIRCUIT TEST FIXTURE

TECHNICAL FIELD

The present invention relates generally to circuit test fixtures and more particularly to high frequency test fixtures for testing monolithic microwave integrated circuits.

BACKGROUND ART

The explosion of high speed communication devices and systems has led to the need for high speed integrated circuits. Circuits operating at speeds higher than one gigahertz are typically classified as microwave circuits and include microwave integrated circuits (MICs). MICs can include both passive and active elements. A typical passive element integrated circuit is a microstrip design, having a conductive ground back plane and a conductive pattern above the ground plane, resting on a dielectric. Passive microwave circuits are typically two ports devices having an input port and an output port. Active circuits include an active element, such as a gallium arsenide transistor, requiting a dc biasing voltage. Thus, in addition to input and output ports, active circuits require one or more dc biasing ports.

To ensure adequate MIC quality and functionality requires high frequency test setups. A typical test setup includes a test fixture to secure and provide contact to the MIC, and a testing system that connects to the test fixture. The high operating frequencies, high through-put, and small geometries of MICs gives rise to a number of testing problems. One common problem centers around how the test fixture makes contact with the MIC. Erratic and/or undefined signal or ground contact to the MIC can result in degraded or inconsistent test results. Thus, repeatable, nondestructive test fixture contact to both the signal and ground contacts of an MIC remains an important goal in the MIC industry.

Two port MIC designs will have an input port pad and an output port pad. Testing requires that a test fixture probe land on these pads to carry the signal input from the testing system to the device, and to carry the resulting signal output away from the device to the testing system. Three critical aspects arise from the test fixture probe-to-MIC pad contact. Such a contact must be in the proper location, have the proper contact force, and have sufficient contact definition between the probe and pad. Testing with a misaligned probe can result in the probe entirely missing the pad, or contacting an edge of the pad, creating an intermittent or high impedance contact, which in turn, creates erroneous testing results.

Test fixture probe force also plays a critical role in the testing of MICs. A probe arriving with too much force onto an input or output pad can tear through the pad, not only giving erroneous results, but also permanently damaging the MIC pad. Conversely, insufficient force can lead to intermittent contact, also resulting in erroneous test results.

Test fixture probe contact definition refers to the amount of surface area contacted by the probe. This aspect of testing MICs is important as, unless the probe contacts enough surface area of the circuit pad, a high contact resistance, or even intermittent test contact may result, again, adversely effect testing results.

Equally as important as the test fixture signal probe contacts, is the test fixture ground contact. The MIC ground is commonly a single conductive plate on the underside of the MIC package. By placing the MIC in a recessed area, improper ground contact, with relatively high inductance, can also occur. Presently existing test fixtures, wherein the circuit is simply dropped onto a parallel planar surface acting as ground, can create erroneous results if contact is made at different places on the back plane (i.e. if the surfaces are not perfectly flat). For example, on a first test, one edge of ground plane could be contact to the ground plate, while on a subsequent test the opposite edge could be contacted to the ground plate. In such an example, the varying current paths can result in varying test results.

Yet another testing problem arises from the fact that MICs are of microstrip design, and circuit test systems have coaxial inputs and outputs. The abrupt transition within test fixtures from a coaxial line to a microstrip can result in a relatively high mismatch in impedance, creating problems in calibration.

For all of the above reasons it is desirable to provide a microwave circuit test fixture that reduces the adverse of effects of abrupt coaxial-to-micro strip transitions. It is further desirable to provide a microwave test fixture that provides repeatable, nondestructive and accurate ground and signal contact, with proper contact location, geometry, force and definition.

BRIEF DESCRIPTION OF THE INVENTION

It is an object of the present invention to provide a microwave circuit test fixture with repeatable ground contacts.

It is a further object of the present invention to provide a microwave text fixture with repeatable input and output carry through signal contacts.

It is yet another object of the present invention to provide a microwave circuit test fixture that provides controlled input and output signal contact force.

Yet another object of the present invention is to provide a microwave circuit test fixture that reduces the abruptness of the coaxial-to-microstrip transition that occurs between a test fixture and microstrip microwave circuit.

Briefly, the preferred embodiment of the present invention is a microwave test fixture for testing a passive microwave integrated circuit (MIC) of two port design. The preferred embodiment includes a first signal block, an opposing second signal block, and circuit receiving test bed between the first and second signal blocks. Each signal block, as well as the test bed is constructed of conductive material.

The first and second signal blocks are identical with the first signal block having a first overhang portion and the second signal block having an second overhang portion, opposite to the first overhang portion. The circuit test bed is positioned over spring loaded vertical travel posts pretensioned to force the circuit test bed in an upward direction. At rest, the circuit test bed is forced upward where it contacts each overhang portion, which, together, act as an emergency stop for the motion of the test bed. Downward force moves the circuit bed away from the overhang portions.

The first signal block and second signal blocks have a first connector assembly and second connector assembly, respectively. Each connector assembly is designed to accept standard connectors, with the mating configurations for each forming a secure connection.

The first signal contact assembly extends horizontally, within a vertical first channel that is set within the first signal block. The first signal contact assembly includes a first signal contact end which extends beyond the first signal block, below the first overhang portion. In the same manner, a second signal contact assembly, having a second signal contact end, is situated within a second channel that is set within the second signal block.

The circuit test bed includes a first spring face and a second spring face having ground elements in the form of a first leaf spring and a second leaf spring, respectively. Each leaf spring is pretensioned to extend away from its respective spring face. Because the test bed is disposed between the first signal block and second signal block, the first leaf spring extends away the first spring face and contacts the first signal block, while the second leaf spring contacts the second signal block. Each leaf spring is of sufficient length so as to extend slightly above the circuit test bed and apply upward force on the bottom of a tested MIC and such that this portion makes the initial contact with the MIC.

In operation, an MIC, having an input pad, an output pad, and a ground backplane, is positioned within the circuit test bed. The pretension force on the test bed forces the test bed upward and the top of the MIC contacts the overhang portions of the first and second signal blocks. In this manner, the circuit is secured within the test fixture. Simultaneously, the first signal contact end lands on the input pad and the second signal contact end lands on the output pad. Each signal contact end is designed to make an optimal contact definition with the pad, with the signal contact assemblies themselves acting as leaf springs to assure sufficient contact force to the pad for good contact definition, while providing limited force, so as to prevent damage to the pads.

When the MIC is forced upward and stopped by the overhang portions of the signal blocks the leaf springs make contact with the ground backplane of the MIC. In this position, each leaf spring is spring loaded upwards and outwards. The leaf springs terminate in a curved and chamfered portion having an apex, so that the apex of the first leaf spring contacts the ground plane with the remaining portions of the first ground contact coming into contact at two points, with the opposing signal block. Likewise, the second leaf spring makes simultaneous contact to the ground backplane and second signal block.

It is noted that the while the above brief description sets forth a test fixture for a two port MIC, one skilled in the art would recognize that a test fixtures for MICs having three or more ports could be created by adding signal blocks and modifying the test bed to include corresponding leaf spring ground contact. It is also noted that the dc biasing currents can be provided through an additional block to test an MIC having active devices.

The present invention also reduces the problems associated with the abruptness of a coaxial to microstrip transition. The signal contacts (probes), which are situated within their respective channels inside the signal blocks, act generally as a "slab line". Thus, a signal going into the test fixture now passes from a coaxial input line, into the "slab line" of the test fixture probe, and then into the microstrip of the MIC.

An advantage of the present invention is that it provides an intermediary slab line portion reducing transition effects between a coaxial and microstrip design.

Yet another advantage of the present invention is that it provides a microwave test fixture with signal contacts of optimal force.

Still another advantage of the present invention is that it provides a microwave test fixture with ground contacts of optimal force.

Another object of the present invention is that it provides a microwave circuit test fixture with signal contacts with increased contact definition and proper contact placement.

These and other objects and advantages of the present invention will become clear to those skilled in the art in view of the description of the best presently known mode of carrying out the invention and the industrial applicability of the preferred embodiment as described herein and as illustrated in the several figures of the drawing.

BEST MODE OF CARRYING OUT THE INVENTION

Figure 1:
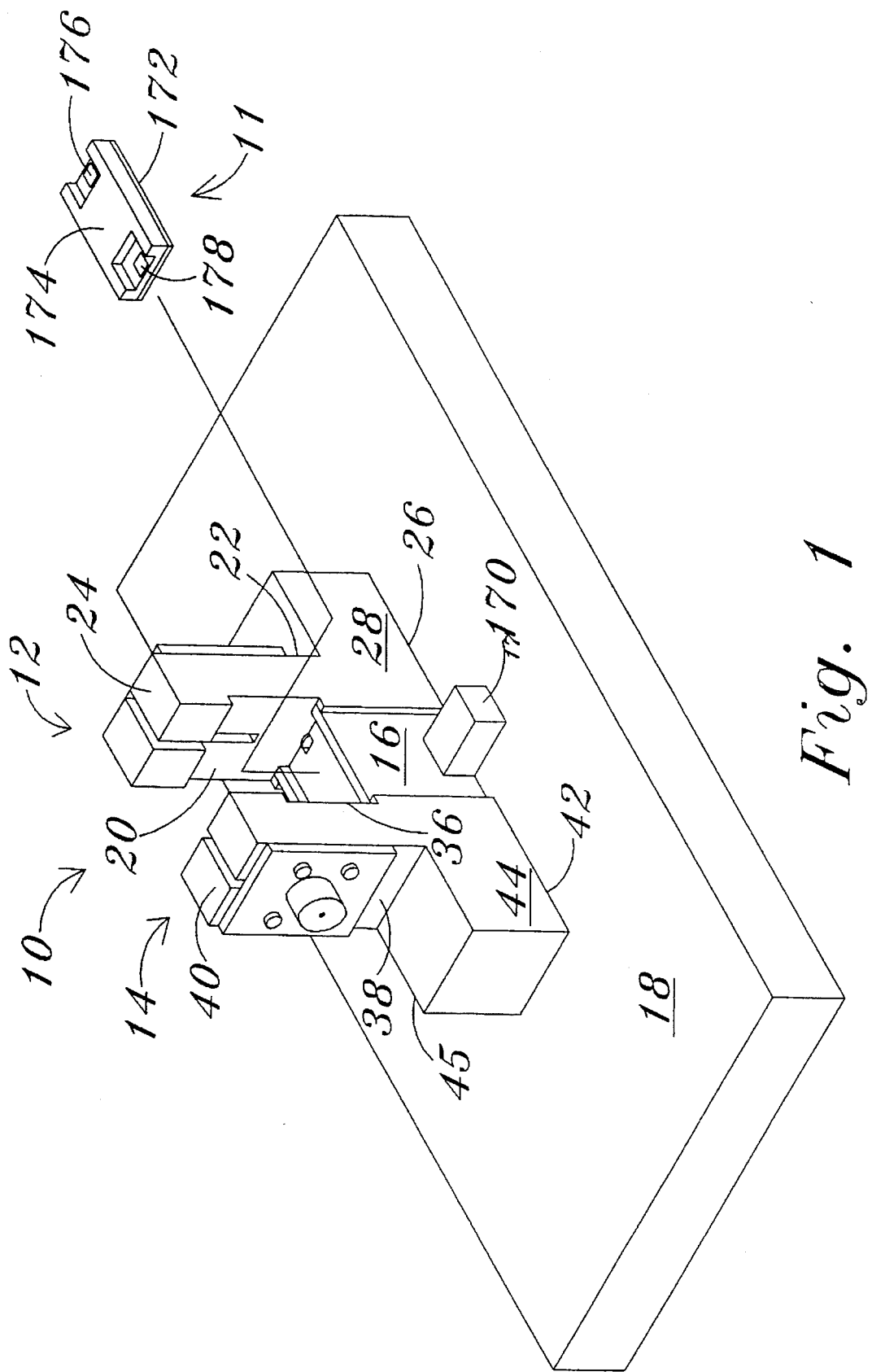
FIG. 1 is an isometric view of the preferred embodiment of the present invention in the "load" position.

The best mode of carrying out the present invention is a microwave test fixture for testing a two port microwave integrated circuit (MIC). The preferred embodiment is set forth in FIG. 1, and designated by the general reference character 10. A typical MIC to be utilized with the test fixture 10 is illustrated in position to be mounted thereon. The MIC is designated by the reference character 11.

As is best illustrated in FIG. 1, the preferred embodiment 10 includes a first signal block 12, a second signal block 14 and a circuit bed 16. Both signal blocks (12 and 14) are attached to a base plate 18. The circuit bed 16 is free to travel between the first signal block 12 and the second signal block 14 in a limited vertical direction between a "load" and a "test" position. FIG. 1 illustrated the "load" position, characterized by the lowest vertical position of the circuit bed 16.

As set forth in FIG. 1, the first signal block 12 is an "L" shaped block structure that includes a first inside face 20, a first outside face 22, a first top face 24, and a first bottom face 26. In addition, the first signal block has a first front side 28 and a first rear side (not shown in the figure). The first bottom face abuts the base plate 18.

Figure 2:
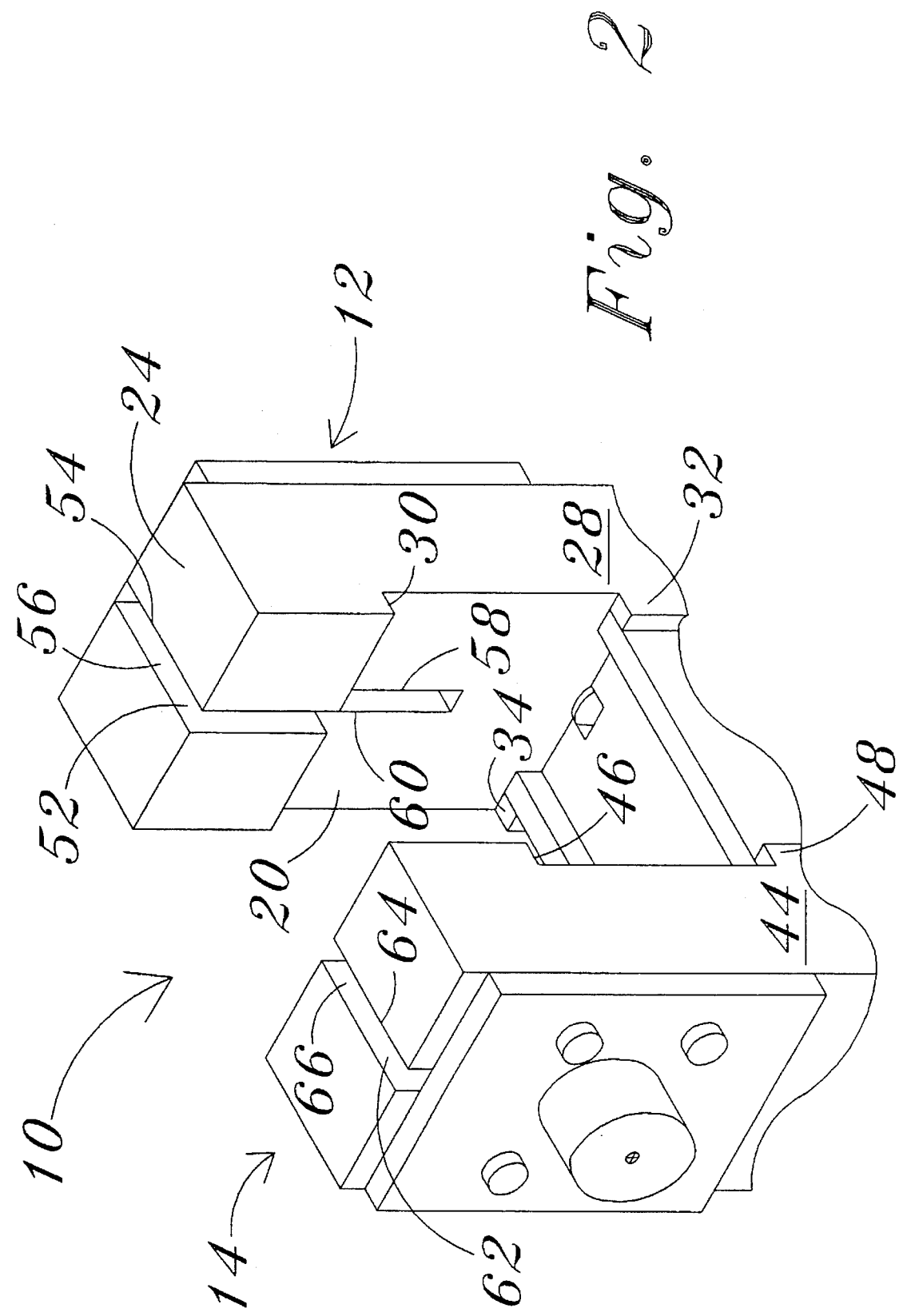
FIG. 2 is an isometric view of a portion of the signal blocks of the preferred embodiment.

Referring now to FIG. 2, a magnified portion of FIG. 1 is set forth. As shown in the figure the first inside face 20 of the first signal block 12 includes a first overhang 30, a first front retaining lip 32, and a first rear retaining lip 34. The first overhang 30 is a portion of the first signal block 12 that extends away from the first inside face 20 in a horizontal direction. The first front retaining lip 32 is a vertically disposed extension from the first inside face 20 that is flush with the first front side 28. The first rear retaining lip 34 is parallel to the first front retaining lip 32, and like the from retaining lip 32, extends away the first inside face 20.

As shown in FIG. 1, the second signal block 14 mirrors the first signal block 12 and so includes a second inside face 36, a second outside face 38, a second top face 40, second bottom face 42, a second front side 44, and a second rear side 45. As shown in the magnified view of FIG. 2, like the first signal block 12, the second signal block 14 has a second overhang 46, a second front retaining lip 48, and a second rear retaining lip (not shown).

Figure 3:
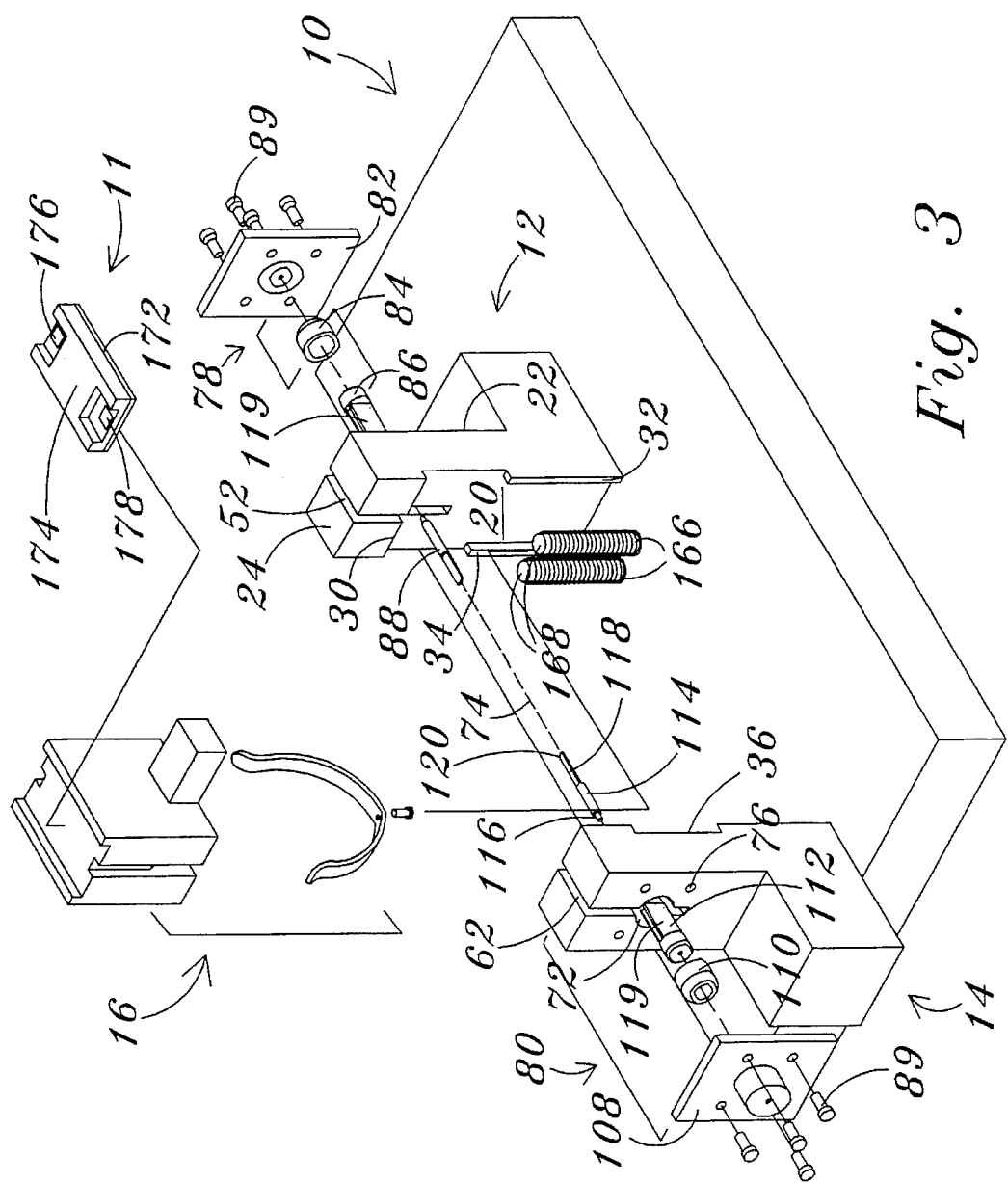
FIG. 3 is a fanciful exploded view of the preferred embodiment of the present invention.

In the preferred embodiment 10, as illustrated in FIG. 2 and the exploded view of FIG. 3, a first channel 52 is set within the first signal block 12. The first channel 52 extends in a vertical downward direction beginning at the first top face 24 and terminating within the first signal block 12. The first channel 52 channel ends at a point below the first overhang 30, but above the first retaining lips (32 and 34). Horizontally, the first channel 52 extends from the first inside face 20 to the first outside face 22.

As set forth in FIG. 2, the straight cut first channel 52 is perpendicular to the first inside face 20 and creates a smooth, vertical first front channel face 54 and a first rear channel face 56. As is best shown in FIG. 2, the intersection of the first channel 52 with the first inside face 20 creates a first front channel edge 58 and a first rear channel edge 60. Because the first channel 52 is perpendicular to the first inside face 20, each channel edge (58 and 60) forms a right angle. Like the first signal block 12, a second channel 62 is disposed within the second signal block 14, and so forms a second front channel face 64, a second rear channel face 66. As in the case of the first channel 52, the second channel 62 intersects the second inside face 36 and forms a fight angle second front channel edge (not shown) and second rear channel edge (not shown).

Figure 4:
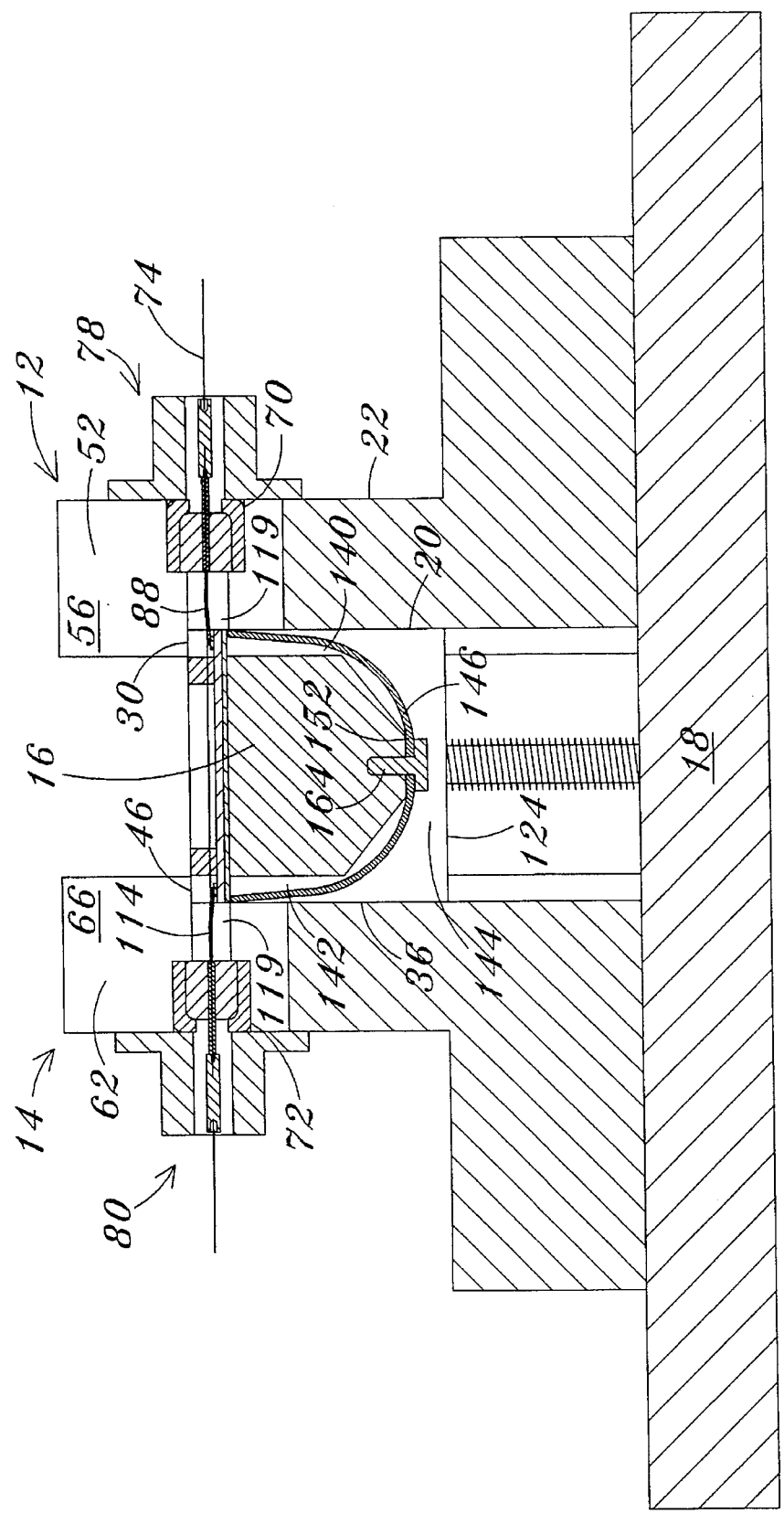
FIG. 4 is a side cross sectional view of the preferred embodiment of the present invention in the "test" position.

As shown in the cross sectional view of FIG. 4, the first and second signal blocks (12 and 14) have a first connection aperture 70 and a second connection aperture 72, respectively. The first connection aperture 70 has the shape of a right cylinder that begins from approximately halfway within the first signal block 12 and opens into the first outside face 22. The first connection aperture 70 can be conceptualized as being disposed about an imaginary central axis, designated by reference character 74 in the various figures. If viewed from a side view, as is shown in FIG. 4, the central axis 74 is situated below the first and second overhangs (30 and 46), parallel to the base plate 18. If viewed directly from the above, in the preferred embodiment 10, the central axis 74 would bisect the first and second channels (52 and 62) being parallel to the channel faces (56 and 66).

As shown in FIGS. 3 and 4 the first and second connector apertures (70 and 72) receive a first connector assembly 78 and a second connector assembly 80, respectively.

Figure 5:
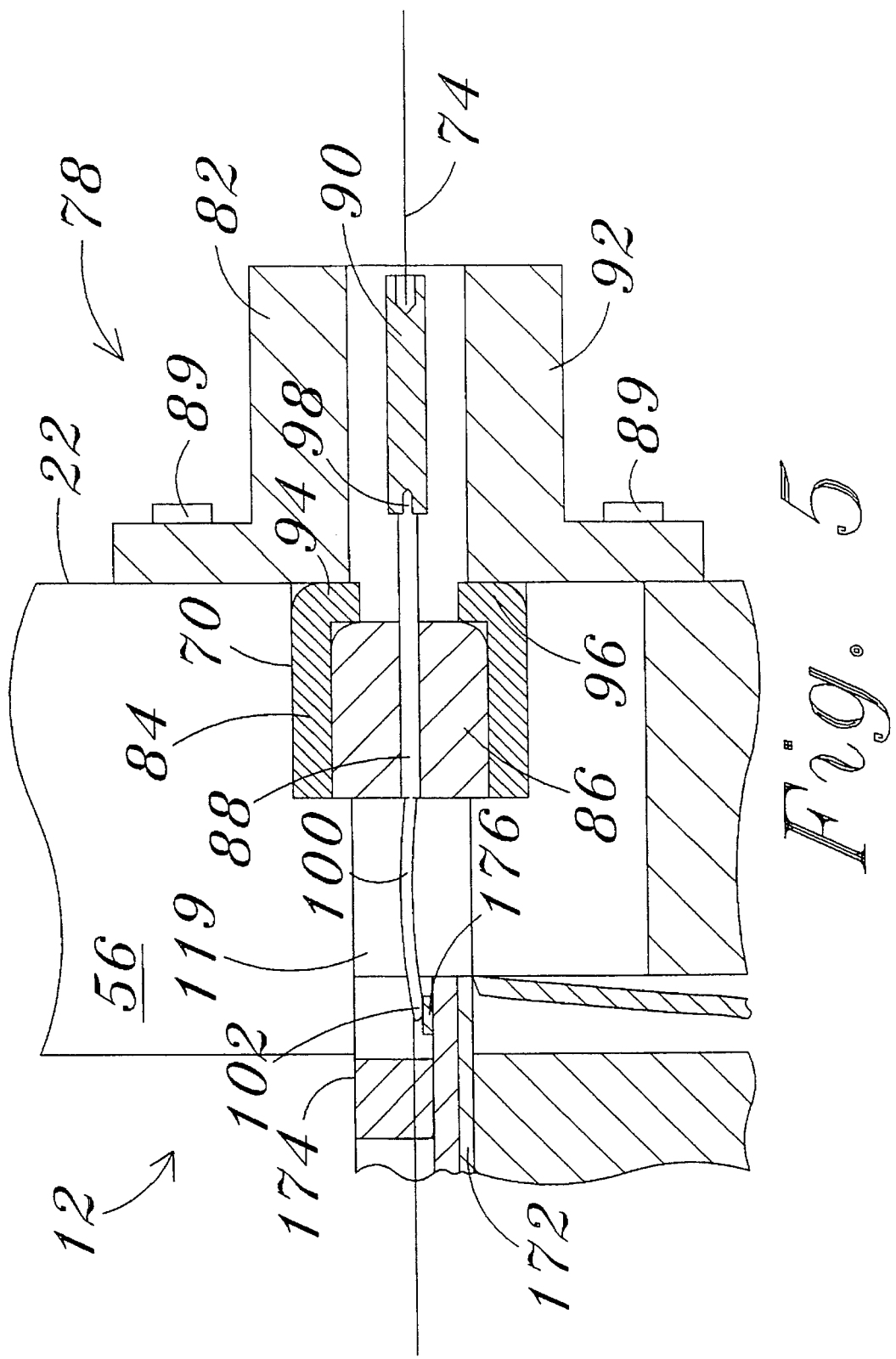
FIG. 5 is a side cross sectional view of a portion of the preferred embodiment of the present invention in the "test" position.

The connector assemblies (78 and 80) are best understood by referring to the exploded view of FIG. 3 and the partial cross sectional view of FIG. 5. As set forth in the figures, the first connector assembly 78 positioned within the first connector aperture 70. The first connector assembly 78 includes a first coaxial connector 82, a first sleeve 84, a support bead element, referred to as a first bead 86, and a first signal contact 88. The first coaxial connector 82 is a female-female connector abutting the first outside face 22, and disposed about the central axis 74. In the preferred embodiment 10, the first coaxial connector 82 is selected to be a commercially available Wiltron "K" connector. The first coaxial connector 82 is attached to the first signal block 12 by four attachment screws 89 which extend through the first coaxial connector 82 into the attachment apertures 76 (shown on the second signal block 14 in FIG. 3 ). As is well known in the art, and set forth in FIG. 5, the first coaxial connector 82 includes a first inner conductor 90 and a first outer conductor 92 and a support bead (not shown).

As illustrated in FIG. 5 the first sleeve 84 is a generally annular structure shaped to seat within the first connector aperture 70 and coaxial with the central axis 74. The first sleeve 84 includes an outer end 94 that is characterized by an outward bowing restricting lip 98. In the preferred embodiment 10, the first sleeve 84 is constructed of a conductive material so that the first outer conductor 92 makes contact with the restricting lip 96 of the first sleeve 84, which in turn, is in contact with the first signal block 12. As the first outer conductor 84 is at ground, this arrangement ensures the first signal block 12, a conductive body, is also at ground.

As illustrated in FIG. 5, the first bead 86 (support bead) of the preferred embodiment 10 is an annular structure shaped to fit within the first sleeve 84. Like the first sleeve 84 and the first coaxial connector 82, the first bead 86 is coaxial with the central axis 74. Unlike the first sleeve 84, the first bead 86 is constructed of an insulative material, such as "Noryl" or "Teflon", in order to provide minimal microwave loss. As described above, outward horizontal movement of the first bead 86 toward the first coaxial connector 82 is prevented by the restricting lip 96 of the first sleeve 84. Inward horizontal movement of the first bead 86, away from the first coaxial connector 82, is prevented by the inner bead abutting the first signal block 12.

The first signal contact 88 of the preferred embodiment 10, as is illustrated in FIG. 5, is situated within the first bead 86 and aligned generally along the central axis 74. The first signal contact 88 is set forth in more detail in FIG. 6, and includes a male connector end 98, a contact spring section 100, and a first contact end 102. The contact spring section 100 is characterized by a thinning of the first signal contact 88 from a generally cylindrical shape, to a horizontally disposed leaf spring shape, although the same result can also be obtained by utilizing a two piece structure. This thinning begins at a contact spring transition section 104 of the first signal contact 88. The contact spring section 100 is pre-bent so as to be biased in a downward direction.

As is best shown in FIG. 5, the male connector end 98 mates with the first inner conductor 90 of the first coaxial connector 82. The horizontal leaf spring shape of the contact spring section 100 makes the entire contact spring section 100 a directional spring that pivots in a vertical plane, but remains stiff in the horizontal direction. The first signal contact 88 is insulated from the other components of the microwave circuit test fixture 10 by the first bead 86, allowing completion of a conductive path from the first inner conductor 90 of the first coaxial connector 82 to the first contact end 102 of the first signal contact 88. As illustrated in FIGS. 3 and 5, the first bead 86 includes two parallel dielectric arms 119 which physically guide (on two sides) the contact spring section 100 within the first channel 52. The function and construction of the dielectric arms 119 will be discussed in detail hereinafter.

In the preferred embodiment 10 the second connector assembly 80 is identical to the first connector assembly 78, having the same components. These are set forth in FIG. 3 and include a second coaxial connector 108, a second sleeve 110, a second bead 112 (a support bead similar in form and function to first bead 82) having dielectric arms 119, and a second signal contact 114. The second signal contact 114, like the first signal contact 88, includes a second male connector end 116, a second contact spring section 118 and a second contact end 120.

In the preferred embodiment 10, as illustrated in FIGS. 1, 3 and 4, the assembly identified as the circuit bed 16 is disposed between the first signal block 12 and the second signal block 14. The circuit bed 16 is shown in more detail in an exploded view in FIG. 7 and is shown to have generally cubic shape including a bed top 122, a bed bottom 124, a bed first end 126, a bed second end 128, a bed front 130, and a bed rear 132. The bed top 122 includes a from bed lip 134 and a rear bed lip 136. The front and rear bed lips (134 and 136) and bed top 122 are dimensioned so as to snugly receive a standard microwave integrated circuit 11, and also serve as emergency "stop" components when no circuit is present.

In the preferred embodiment 10, the bed first end 126 includes a first spring channel 140. The first spring channel 140 is centered in the bed first end 126 and extends vertically from the bed top 122 to the bed bottom 124. The bed second end 128 of the circuit bed 16, like the bed first end 126, includes a second spring channel 142.

Referring now to FIG. 4, in the preferred embodiment 10, the bed bottom 124 includes a bottom channel 144 that joins the first spring channel 140 to the second spring channel 142. As illustrated in the figure, the first spring channel 140 opposes the first inside face 20 of the first signal block 12. The second spring channel 142 mirrors the first spring channel 140, and opposes the second inside face 36 of the second signal block 14.

Figure 7:
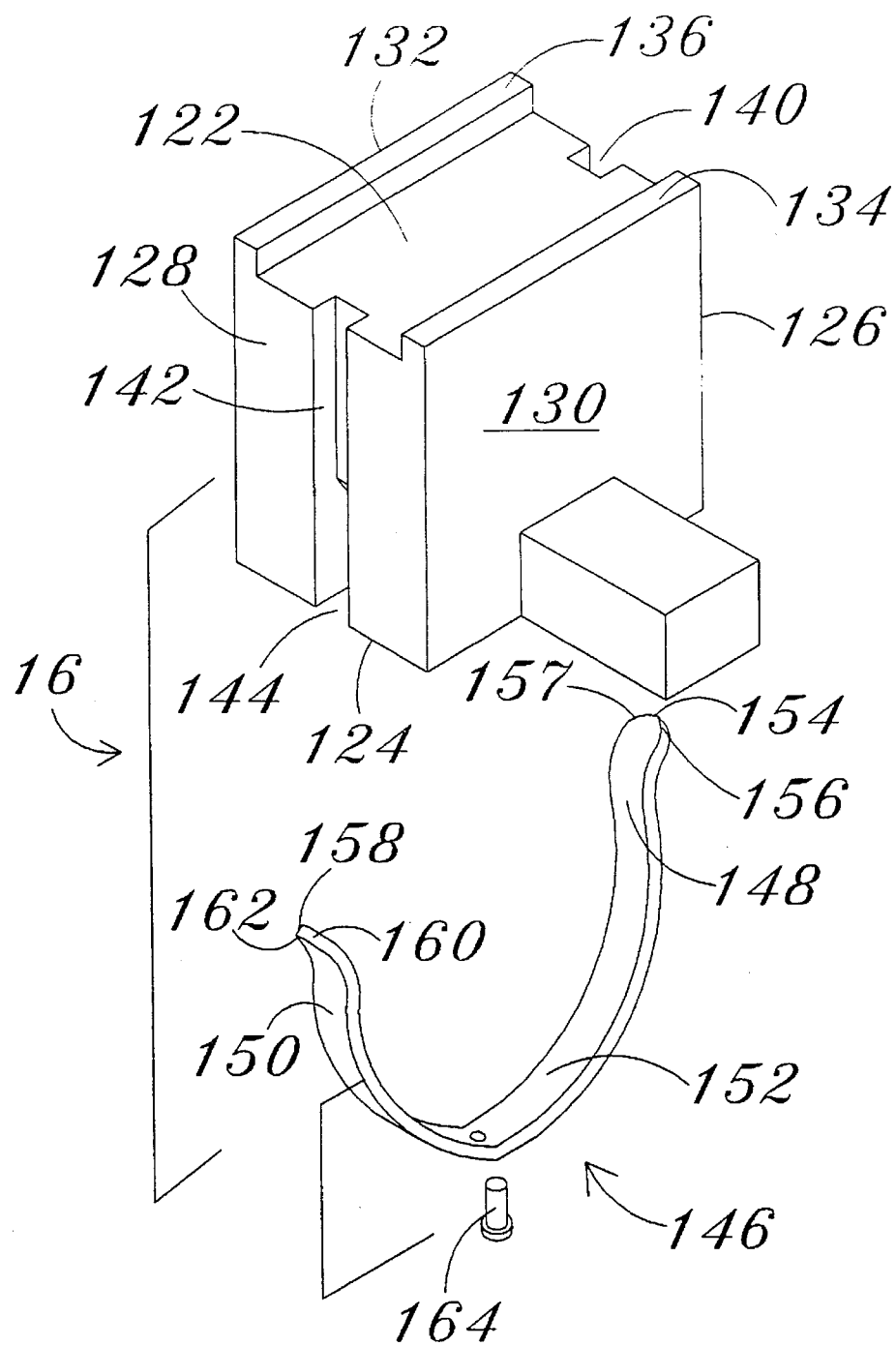
FIG. 7 is an exploded view of the circuit bed of the preferred embodiment.

As is best set forth in FIGS. 4 and 7, in the preferred embodiment 10, a ground leaf spring 146 is positioned within the first spring channel 140, the bottom channel 144 and second spring channel 142. As set forth in FIG. 7, the ground leaf spring 146 has a first ground end 148, a second ground end 150 and a middle portion 152. The first ground end 148 is curved, forming a first contact apex 154, a first front contact surface 156 and a first rear contact surface 157. The second ground end 150 mirrors the first contact end 148, having a second contact apex 158, a second front contact surface 160 and a second rear contact surface 162. As shown in both FIGS. 4 and 7, the ground leaf spring 146 is mechanically attached at the middle portion 152 to the bottom channel 144 by a ground screw 164. The ground leaf spring 146 is curved to fit into the first spring, second spring, and the bottom channels (140, 142 and 144). The ground leaf spring 146 is of sufficient length to allow the first ground end 148 and second ground end 150 to extend above the bed top 122. It is noted that the ground ends (148 and 150) do not extend above the bed lips (134 and 136). This prevents the ground ends (148 and 150) from contacting the overhang portions (30 and 46) and being subjected to undesirable force. If the circuit bed 16 is empty (no MIC is loaded therein), as the circuit bed 16 is raised, the bed lips (134 and 136) will contact the overhang portions (30 and 46) stopping the circuit bed. 16, and protecting the ground leaf spring 146.

In the preferred embodiment 10, the ground leaf spring 146 is pretensioned to force the first ground end 148 and the second ground end 150 away from the bed first end 126 and the bed second end 128, respectively. The pretensioned arrangement ensures that, regardless of the vertical position of the circuit bed 16, the first ground end 148 maintains contact with the first inside face 20 of the first signal block 12 and the second ground end 150 maintains contact with the second inside face 36 of the second signal block 14, as is illustrated in FIG. 4.

A comparison of FIGS. 1 and 3 shows how the circuit bed 16 moves vertically immediate the first and second signal blocks (12 and 14). Upward movement of the circuit bed 16 is limited by the overhang portions (30 and 46). Forward and rearward movement is eliminated by the from (32 and 48) and rear retaining lips (34 and 50), respectively. Side to side movement is eliminated by the inside faces (20 and 36) of the first and second signal block (12 and 14).

In the preferred embodiment 10, the circuit bed 16 is pretensioned in an upward direction. As set forth in FIG. 3, the circuit bed 16 is pretensioned by a pair of load springs 166 arranged around a pair of guide pins 168 which extend upward from the base plate 18 between the signal blocks (12 and 14). The bed bottom 124 includes a pair of spring apertures (not shown) for receiving the guide pins 168 and associated load springs 166. In the rest position (unloaded, without an MIC on the bed top) the circuit bed 16 is in its highest position with the bed lips (134 and 136) abutting the overhang portions (30 and 46). As mentioned previously, the bed lips (134 and 136) prevent the ground ends (148 and 150) from contacting the first and second contact ends (102 and 120) in order to prevent damage thereto from undesirable contact.

Having set forth the majority of the components of the present invention 10, attention is now directed to the two operating positions, the load position and the test position.

The load position is illustrated in FIG. 1. The circuit bed 16 is lowered by applying downward force to a load arm 170 to fully expose the bed top 122. In the load position the MIC 11 can be placed into the circuit bed 16. The dimensions of the circuit bed 16 are such that the MIC 11 is positioned by the bed lips (134 and 136).

The test position of the preferred embodiment 10 is characterized by the microwave test fixture 10 holding an MIC 11 within the circuit bed 16 in such a manner that proper contact is created and maintained during the test procedures. As set forth in FIGS. 1, 3, and 5, the MIC 11 includes a bottom ground plate 172 (or a functional equivalent such as a conductive film), a top surface 174, a first pad 176, and a second pad 178. As is illustrated in cross section in both FIGS. 4 and 5, in the test position, the MIC 11 is secured between the circuit bed 16 and the overhangs (30 and 46) by upward force provided by the load springs 166. The test position is further characterized by the signal contacts (88 and 114) making contact with the MIC pads (176 and 178), and the ground leaf spring 146 making contact with the MIC ground plate 172 and the inner surfaces (20 and 36). The load springs 166 provide the vertical force to cause engagement while horizontal front and rear contact is caused by the pretensioning (biasing) of the ground leaf spring 146.

Figure 8A:
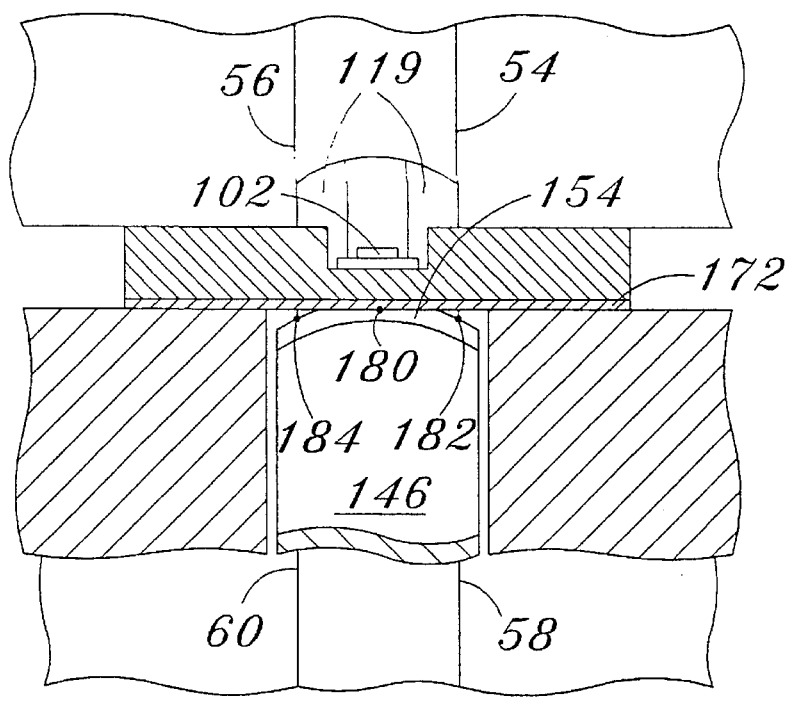
FIG. 8a is a side view of the MIC ground contact of the preferred embodiment.
Figure 8B:
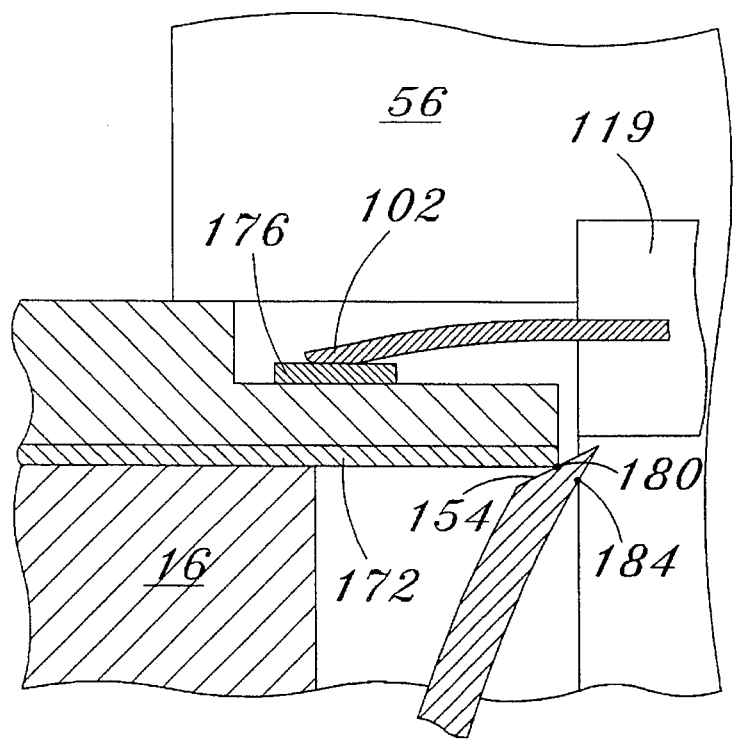
FIG. 8b is a front view of the MIC ground contact of the preferred embodiment.

A detailed illustration of the contact between the ground leaf spring 146 and the MIC ground plate 172, of the preferred embodiment 10, is illustrated in a side view in FIG. 8a and a front view in FIG. 8b. As is best shown in FIG. 8a, in the test position, the ground leaf spring 146 provides a three point contact between the ground plate 172, the first front channel edge 58, and the first rear channel edge 60. As will be recalled, the first and second signal blocks (12 and 14) are conductive bodies at ground, and so correspondingly, the channel edges (58 and 60) are at ground. The three point contact is defined by the first contact apex 154 engaging the ground plate 172 at a top contact point 180, the first front contact surface 156 engaging the first front channel edge 58 at a front contact point 182, and the first rear contact surface 157 engaging the first rear channel edge 60 at a rear contact point 184. As is best shown in FIG. 8b, the first contact apex 154 is chamfered to provide tolerance insensitivity and a more secure contact with the ground plate 172. Unlike the prior art, the ground contact arrangement illustrated in FIGS. 8a and 8b provides a critical minimum length current path between the grounded channel edges (58 and 60) and the ground plate 172. This reduces the inductance presently noted in the prior art. This arrangement also provides repeatable and tolerance insensitive ground contacts to the ground plate 172 of the MIC 11.

In the test position of the preferred embodiment 10, at the same time ground contact is made with the ground plate, as the MIC 11 is forced upward, the first and second pads (176 and 178) engage the contact ends (102 and 120) of the first and second signal contact (88 and 114). The contact spring sections (100 and 118) of the signal contacts (88 and 114) are flexed upward allowing the contact end (102 and 120) to maintain contact with the pads (176 and 178). The amount of flexibility provided by the signal contacts (88 and 114) ensures that the pads (176 and 178) are not significantly damaged while providing enough force to produce good contact pressure. In addition, the position of the signal contacts (88 and 114) correspond to the standardized positions of the pads (176 and 178) on the MIC 11. Thus, repeatable, identical, and well defined contact between the pads (176 and 178) of subsequently tested MICs 11 and signal contacts (88 and 114) is possible, without any misalignment occurring.

Figure 6:
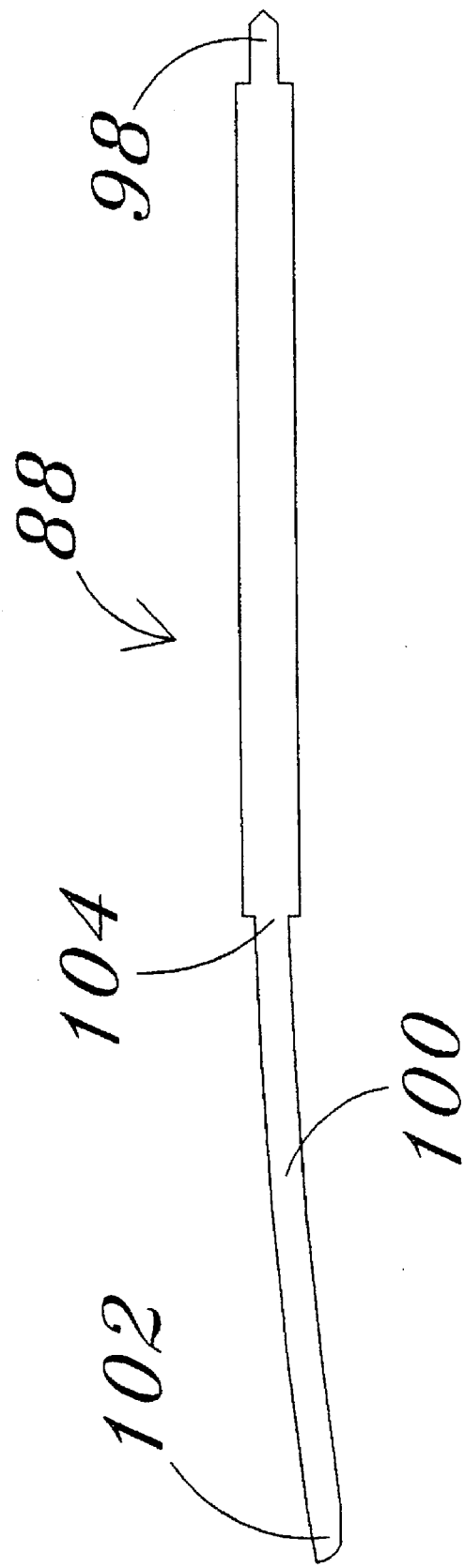
FIG. 6 is a side cross sectional view of the first signal contact.

The shape of the signal contacts (88 and 114) provides for improved contact definition. As is best illustrated in FIG. 6, the contact spring section 100 of the first signal contact 88 (as well as the second signal contact 114, which is identically shaped) is pre-bent in a generally downward direction, and the first contact end 102 is rounded in shape. As shown in FIG. 8b, the downward shape of the contact spring section 100 allows the first contact end 102 to contact the first pad 176 while at the same time avoiding contact with other portions of the MIC. The rounded shape of the first contact end 102 ensures that the contact end 102 maintains a contact of sufficient surface area over the allowable vertical travel of the contact spring section 100. The rounded shape also causes a wiping action which lowers the contact resistance. The second signal contact 114 operates in an identical manner with the second pad 178 of the MIC 11.

Once the test fixture 10 is in the test position, proper signal and ground contacts are in place, and the MIC 11 is ready to be functionally tested. For example, if the first pad 176 of the MIC 11 is an input pad, and the second pad 178 is an output pad, an input signal can be sent from the first center conductor 90 of the first coaxial connector 82, via a testing system generator and associated input lead (not shown), through the first signal contact 88, and on to the first pad 176. The output signal will then pass from the second pad 178, through the second signal contact 114, and out the inner conductor of the second coaxial connector 108 into a testing system detector and associated output lead (not shown).

Figure 9A:
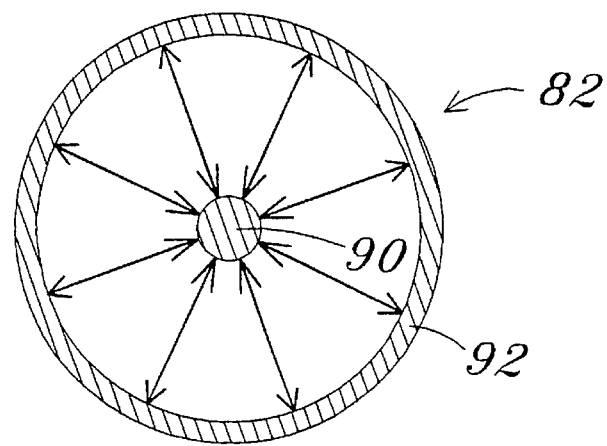
FIG. 9a is a cross sectional view taken through a coaxial connector of the preferred embodiment, also showing the electric field pattern.
Figure 9B:
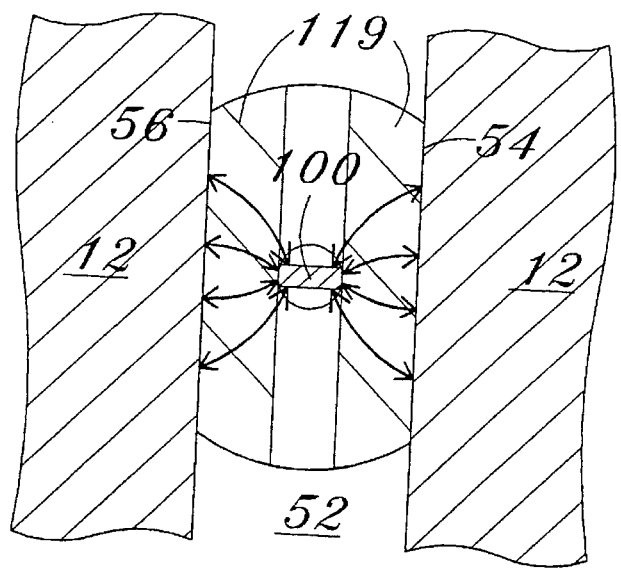
FIG. 9b is a cross sectional view taken through a signal contact in a channel of the preferred embodiment, also showing the electric field pattern.
Figure 9C:
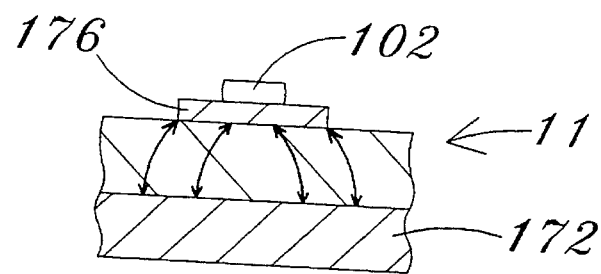
FIG. 9c is a cross sectional view taken through the contact end of the signal contact of the preferred embodiment, also showing the electric field pattern.

As mentioned previously, the preferred embodiment 10 provides an advantage over prior systems by creating a system which reduces the abruptness of the prior coaxial-to-microstrip transition. The advantages of the preferred embodiment are best illustrated in FIGS. 9a–c. FIG. 9a is a cross sectional view through the first coaxial connectors 82, illustrating in diagrammatic form, the electric field between the first outer conductor 92 and the first inner conductor 90 during test. FIG. 9b is a similar cross section view through the first channel 52 illustrating the contact spring section 100 disposed between the dielectric arms 119 (dielectric filled slabline). Also set forth in FIG. 9b is the electric field, now passing from the contact spring section 100, through the dielectric arms 119 and to the front and rear channel faces (54 and 56). It is noted that even though the contact spring section 100 moves in a vertical direction within the first channel 52, the impedance remains essentially the same. The dielectric arms 119 ensure that the contact spring section 100 remains centered within the first channel 52, set the characteristic impedance of the contact spring section, and prevent the contact spring section 100 from shorting out on either channel face (54 or 56). FIG. 9c illustrates the well known electric field of the microstrip on the MIC 11. As is evident from FIGS. 9a–9c, the tow step slabline-like transition, illustrated in FIG. 9b provides an intermediate structure that is less abrupt, than a standard single step coaxial-to-microstrip transition. A corresponding compensation is provided by additional length in the line sections (88 and 114) which result in desired contact pressure conditions.

One skilled the art would recognize that the two port example illustrated by the preferred embodiment 10 would not limit the invention MICs of two port design. A test fixture for multi-port MICs follows directly from the above example. Additional signal blocks with accompanying probes and connector assemblies can be provided for each additional pad on a multi-port MIC, including dc biasing pads. If desired, additional ground leaf springs may also be added.

While the preferred embodiment 10 utilizes spring loaded guide pins 166 and 168 to raise and lower the circuit bed 16, alternate methods may also be employed. Among the many alternate examples are pneumatic, hydraulic or motorized drives may be used to raise and lower the circuit bed 16. Such methods are particularly appropriate when the microwave test fixture 10 is used with an autoloading device. Movement could also be provided to the circuit bed 16 from the bed bottom 124 via a push rod or the like.

The ground leaf spring 146 design of the preferred embodiment 10 should also not be read as limiting the breadth of the present invention. The ground leaf spring 146 could be comprised of two or more individual leaf springs, each extending upward and outward from the bed top. In such an arrangement the MIC is positioned well above the bed top on the ground springs themselves.

The signal contacts (88 and 114) could also be modified. Cylindrical signal contacts with narrowed portions that create flexible points are just one of the many possible variations possible.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The microwave test fixture of the present invention 10 may be utilized in any application wherein conventional microwave circuit and package testers are used. The preferred embodiment 10 includes coaxial connectors for accommodating standard MIC testing equipment. Among the many improvements are increased contact definition, controlled contact force, reduction in the abruptness of the coaxial-to-microstrip transition, and contact repeatability for signal inputs, signal outputs, and ground backplane contact. Such improvements result in increased testing accuracy, which in turn results in more precise MIC quality assessment.

The signal contacts (88 and 114) and ground leaf spring 146 of the preferred embodiment 10 are constructed of beryllium-copper for the flex and conductivity provided by the material. The insulative beads (86 and 112) are composed of Noryl™ and the coaxial connectors (82 and 108) can be any number of standardized connectors. The remainder of the components are gold plated brass.

Since the microwave test fixtures 10 of the present invention may be readily constructed and easily operated it is expected that they will be acceptable in the industry as substitutes for conventional MIC test fixtures, providing more repeatable and more accurate testing results. For these and other reasons, it is expected that the utility and industrial applicability of the invention will be both significant in scope and long-lasting in duration.

What is claimed is:

1. A multi-port microwave circuit test fixture, comprising:

a test bed for receiving a microwave circuit having a bottom plane and a top surface including contact pads, said test bed being movable in a vertical direction;

a plurality equal to "N" contact springs attached to said test bed, each said contact spring extending above said test bed and pretensioned to extend away from said test bed;

N signal blocks, each said signal block having an inner face, an outer face, and a vertical channel set therein, the vertical channel intersecting the inner face and forming two vertical inner corners on the inner face, each said signal block being disposed with the inner faces opposing said test bed such that each contact spring engages the opposing inner corners of one said signal block;

ground means for grounding the inner corners of each said signal block; wherein said test bed moves upward in a vertical direction into a test position such that each said contact spring simultaneously contacts the bottom plane of the test circuit and the opposing inner corners of one said signal block.

2. The circuit test fixture of claim 1 further including:

N contact means, each said contact means having a signal end and a contact end, each contact end being disposed over said test bed;

N signal coupling means, each said signal coupling means being attached to one said signal block, the signal coupling means receiving a signal conductor and a ground conductor, the coupling means coupling one signal conductor to the signal end of one said contact means; and said ground means includes coupling the ground conductor to the inner corners of one said signal block; wherein in the test position the contact ends of said contact means engage the contact pads of the test circuit.

3. The circuit test fixture of claim 2 wherein:

each said contact means is a semi-rigid conductor and is disposed within one of the vertical channels; wherein in the test position the contact ends resiliently engage the contact pads of the test circuit.

4. The circuit test fixture of claim 3 wherein:

each said signal block includes an insulative bead, each said insulative bead having a contact aperture therein for holding said contact means and a bead face perpendicular to the channel of said signal block; and each said contact means extends from within the probe aperture of one insulative bead and into the vertical channel.

5. The circuit test fixture of claim 4 wherein:

said contact means includes a leaf spring portion and a securing portion, the securing portion being disposed within the insulative bead, the leaf spring portion extending from the securing portion and terminating in the contact end, the leaf spring portion being horizontally disposed so as to flex in a vertical manner.

6. The circuit test fixture of claim 1 wherein:

said test bed includes N vertically disposed spring channels;

each said contact spring being disposed within one of the spring channels and having an attachment end and a contact end, each attachment end being connected to said test bed; wherein in the test position the contact end makes simultaneous contact with the bottom plane of the test circuit and the opposing inner corners of one said signal block.

7. The circuit test fixture of claim 6 wherein:

the contact end of each said contact spring is curved, having an apex and two curved edges; wherein in the test position the apex contacts the bottom plane and the curved edges contact the inner corners.

8. The circuit test fixture of claim 1 wherein:

said test bed is spring loaded to force said test bed into the test position.

9. The circuit test fixture of claim 1 further including:

stop means extending from at least one said signal block for securing said test bed in the test position.

10. The circuit test fixture of claim 9 wherein:

said stop means includes an overhang portion on the inner face of at least one said signal blocks, the overhang portion engaging the test circuit in the test position.

11. The circuit test fixture of claim 1 wherein:

each said signal block is composed of a conductive material; and said ground means includes grounding each said conductive signal block.

12. A circuit test fixture comprising:

a circuit elevator for receiving a circuit, the circuit having a plurality of test pads and a conductive bottom surface;

guide means for raising and lowering the circuit elevator between a load position and a test position, the load position being characterized by the circuit elevator being in a lowered position, the test position being characterized by the circuit elevator being in a raised position;

a plurality of input/output ports disposed around said circuit elevator, each said port including an input/output coupling having a ground conductor and a signal conductor; and a plurality of flexible conductive contacts, each said contact being coupled to the signal conductor of one said port, each contact being positioned above said circuit elevator and aligned over one of the test pads such that in the test position the contacts engage the test pads of the circuit in the circuit elevator.

13. The test fixture of claim 12 wherein:

each said ports include a conductive channel having parallel walls; and at least a portion of each said contact is disposed within the channel of one of the ports, the contact being parallel to the parallel walls.

14. The test fixture of claim 12 further including:

each said port includes an outside face and an inside face, the outside face including a retaining aperture, each said inside face opposing said circuit elevator;

a plurality of contact insulators, one said contact insulator being disposed within one retaining aperture, each said contact insulator having a contact conduit therethrough and a contact inside face, the contact inside face opposing said circuit elevator; and each said contact is disposed through one contact conduit, the contact extending from the outer face to the inner face of said signal block.

15. The test fixture of claim 12 wherein:

said circuit elevator further includes a horizontal top surface and a plurality of leaf spring contacts, each of the leaf spring contacts extending above the top surface and pretensioned to spring away from said circuit elevator, the leaf springs each engaging the conductive bottom surface of the circuit in the test position; and each said port includes a vertically disposed ground face, each ground face opposing and contacting one leaf spring throughout the vertical travel of said circuit elevator, the input output coupling of each said port connecting the ground conductor to the ground face.

16. The test fixture of claim 15 wherein:

each of the leaf springs extends upward from the top surface of said circuit elevator.

17. The test fixture of claim 15 wherein:

said circuit elevator further includes a plurality of vertical port faces, each port face opposing the ground face of one said port and having a vertical leaf spring channel inset therein, one leaf spring being disposed within each leaf spring channel.

18. A test fixture for retaining a microwave circuit having a plurality of contact pads and a bottom ground plane, and for further receiving a plurality of test leads from a circuit tester, comprising:

a circuit cradle for securing a microwave circuit;

elevating means for raising and lowering said cradle;

stop means for providing an upper limit to the vertical travel of said cradle, the upper limit defining a test position of said cradle;

a plurality of tester lead interfaces surrounding said cradle, said tester lead interfaces each receiving a tester lead; and a plurality of conductive spring contact means, one said conductive spring contact means being disposed within each tester lead interface above said cradle, each said spring contact means being connected to a tester lead; wherein in the test position each said conductive spring contact means is deformed in an upward position making pretensioned contact with one of the contact pads of the microwave circuit.

19. The test fixture of claim 18 wherein:

said tester lead interfaces each include a vertical, conductive contact face, each contact face being grounded;

said cradle includes a plurality of semi-rigid ground contacts extending above and away from said cradle, each said ground contact abutting one contact face, the microwave circuit being disposed on top of said ground contacts, the ground contact simultaneously contacting the bottom ground plane and the opposing contact face in the test position.

20. The test fixture of claim 18 wherein:

each said tester lead interface is composed of a conductive material and is grounded; and a insulative ring surrounds a portion of each said conductive spring contact means insulating each said conductive spring contact means from each tester lead interface, each said insulative ring having a vertical ring face opposing said cradle.

* * * * *